(12) United States Patent
Siemieniec et al.

(10) Patent No.: US 10,211,306 B2
(45) Date of Patent: Feb. 19, 2019

(54) SEMICONDUCTOR DEVICE WITH DIODE REGION AND TRENCH GATE STRUCTURE

(71) Applicant: Infineon Technologies AG, Neubiberg (DE)

(72) Inventors: Ralf Siemieniec, Villach (AT); Dethard Peters, Hoechstadt (DE); Romain Esteve, Villach (AT); Wolfgang Bergner, Klagenfurt (AT); Thomas Aichinger, Villach (AT); Daniel Kueck, Villach (AT); Roland Rupp, Lauf (DE); Bernd Zippelius, Erlangen (DE); Karlheinz Feldrapp, Uttenreuth (DE); Christian Strenger, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/866,755

(22) Filed: Jan. 10, 2018

(65) Prior Publication Data
US 2018/0158920 A1    Jun. 7, 2018

Related U.S. Application Data

(63) Continuation of application No. 15/162,716, filed on May 24, 2016, now abandoned.

(51) Int. Cl.
*H01L 29/06* (2006.01)
*H01L 29/10* (2006.01)
(Continued)

(52) U.S. Cl.
CPC .......... *H01L 29/4236* (2013.01); *H01L 29/04* (2013.01); *H01L 29/0696* (2013.01);
(Continued)

(58) Field of Classification Search
CPC .................. H01L 29/41741; H01L 29/7813
See application file for complete search history.

(56) References Cited

U.S. PATENT DOCUMENTS 6,060,744 A    5/2000  Kuwahara et al.
8,637,922 B1    1/2014  Siemieniec et al.
(Continued)

FOREIGN PATENT DOCUMENTS

DE    102014107325 A1    11/2015
JP    2003017699 A    1/2003
(Continued)

*Primary Examiner* — Daniel P Shook
(74) *Attorney, Agent, or Firm* — Murphy, Bilak & Homiller, PLLC (57) ABSTRACT

A semiconductor device includes a semiconductor body formed from a semiconductor material with a band-gap of at least 2.0 eV, the semiconductor body having a diode region and a source region. The semiconductor device further includes a trench gate structure having a first sidewall and a second sidewall opposite the first sidewall, the first sidewall and the second sidewall extending along a common longitudinal direction. A doping concentration of a first doping type is higher in the diode region than in the source region. The trench gate structure projects from a first surface of the semiconductor body into the semiconductor body. A first portion of the second sidewall at the first surface is directly adjoined by the source region. A second portion of the second sidewall is in direct contact with the diode region. Additional semiconductor device embodiments are provided.

21 Claims, 8 Drawing Sheets

(51) Int. Cl.
*H01L 29/78*  (2006.01)
*H01L 29/739* (2006.01)
*H01L 29/04*  (2006.01)
*H01L 29/423* (2006.01)
*H01L 29/40*  (2006.01)
H01L 29/16   (2006.01)
H01L 29/20   (2006.01)

(52) U.S. Cl.
CPC ........ *H01L 29/1095* (2013.01); *H01L 29/407* (2013.01); *H01L 29/7397* (2013.01); *H01L 29/7827* (2013.01); H01L 29/045 (2013.01); H01L 29/1608 (2013.01); H01L 29/2003 (2013.01)

(56) References Cited

U.S. PATENT DOCUMENTS

| | | |
|---|---|---|
| 9,136,372 B2 | 9/2015 | Miyahara et al. |
| 9,293,558 B2 | 3/2016 | Siemieniec et al. |
| 2002/0038887 A1 | 4/2002 | Ninomiya et al. |
| 2003/0003637 A1* | 1/2003 | Ninomiya ....... H01L 21/823487 438/173 |
| 2013/0001592 A1 | 1/2013 | Miyahara et al. |
| 2015/0145028 A1 | 5/2015 | Laven et al. |
| 2015/0340487 A1 | 11/2015 | Siemieniec et al. |

FOREIGN PATENT DOCUMENTS

| | | |
|---|---|---|
| JP | 2015164224 A | 9/2015 |
| WO | 2009122486 A1 | 10/2009 |
| WO | 2016072074 A1 | 5/2016 |

\* cited by examiner

SEMICONDUCTOR DEVICE WITH DIODE REGION AND TRENCH GATE STRUCTURE

BACKGROUND

Wide-bandgap semiconductor devices are based on a semiconductor material with a bandgap of at least 2 eV or at least 3 eV and exhibit lower on-state resistance at high temperatures, lower switching losses and lower leakage currents compared to conventional silicon-based semiconductor devices. Semiconductor devices from wide-bandgap material may include asymmetric transistor cells with stripe-shaped trench gate electrodes that control transistor channels in only one of two opposite longitudinal mesa sidewalls of mesa portions formed from the semiconductor material between neighboring trench gate structures.

It is desirable to improve device characteristics of wide-bandgap semiconductor devices including asymmetric transistor cells with trench gates and to further expand the range of applications for such devices.

SUMMARY

The object is achieved by subject-matter of the independent claims. Dependent claims concern further embodiments.

According to an embodiment, a semiconductor device includes trench gate structures that extend from a first surface into a semiconductor body from a wide-bandgap semiconductor material. The trench gate structures separate mesa portions of the semiconductor body from each other. In the mesa portions body regions form first pn junctions with a drain structure and directly adjoin at least first mesa sidewalls. Source regions in the mesa portions form second pn junctions with the body regions, wherein the body regions separate the source regions from the drain structure. The source regions directly adjoin the first mesa sidewalls and second mesa sidewalls opposite to the first mesa sidewalls.

According to another embodiment a semiconductor device, includes trench gate structures that extend from a first surface into a semiconductor body from a wide-bandgap semiconductor material. The trench gate structures separate mesa portions of the semiconductor body from each other. In the mesa portions body regions form first pn junctions with a drain structure and directly adjoin at least first mesa sidewalls. Source regions in the mesa portions form second pn junctions with the body regions, wherein the body regions separate the source regions from the drain structure. Trench source structures extend from the first surface into the semiconductor body and include trench source electrodes electrically connected to a first load electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be under stood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection through a metal and/or a heavily doped semiconductor. The term "electrically coupled" includes that one or more intervening element (s) adapted for signal transmission may be provided between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
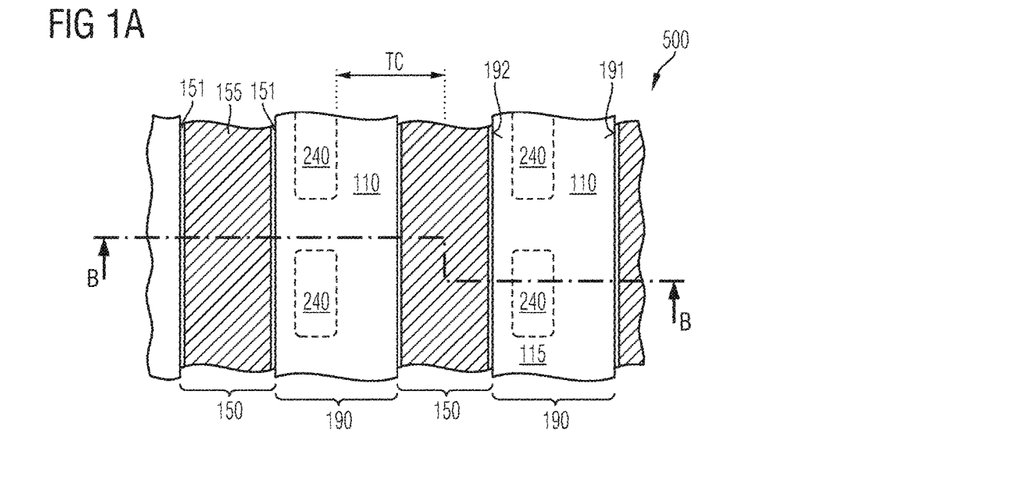
FIG. 1A is a schematic horizontal cross-sectional view of a portion of a wide-bandgap semiconductor device with trench gate structures and with source regions directly adjoining both opposite sidewalls of mesa portions between the neighboring trench gate structures according to an embodiment.
Figure 1B:
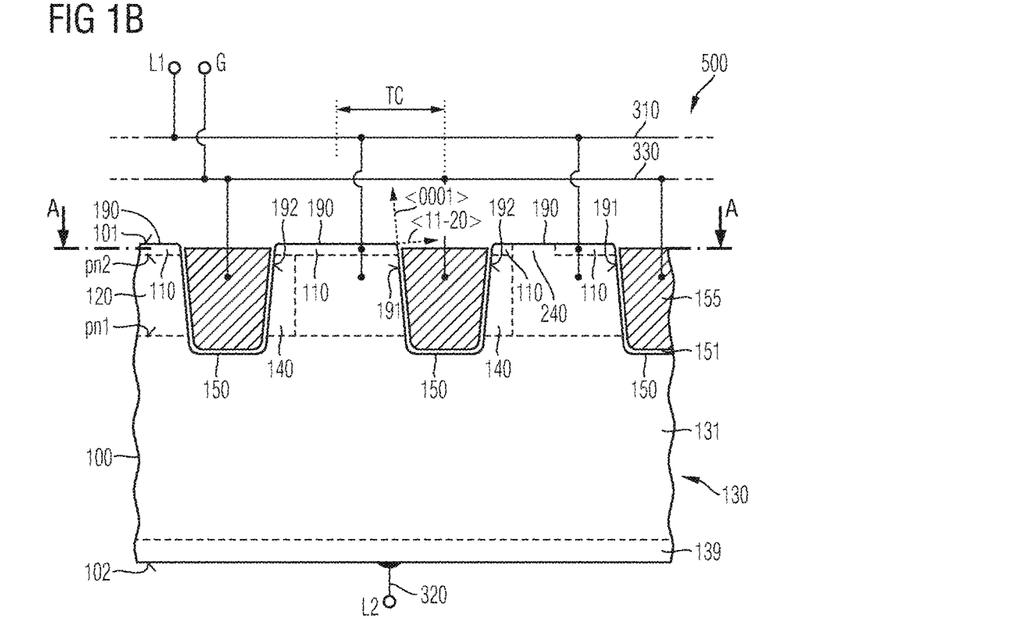
FIG. 1B is a schematic vertical cross-sectional view of the semiconductor device portion of FIG. 1A along line B-B.

FIGS. 1A and 1B refer to a semiconductor device 500 including transistor cells TC. The semiconductor device 500 may be or may include an IGFET (insulated gate field effect transistor), for example, an MOSFET (metal oxide semiconductor FET) in the usual meaning concerning FETs with metal gates as well as FETs with gates from semiconductor material, an IGBT (insulated gate bipolar transistor) or an MCD (MOS controlled diode), by way of example.

The semiconductor device 500 is based on a semiconductor body 100 from a crystalline wide-bandgap semiconductor material with a band-gap of 2.0 eV or higher. The wide-bandgap semiconductor material may have a hexagonal crystal lattice and may be silicon carbide (SiC) or gallium nitride (GaN), by way of example. For example, the semiconductor material is 2H—SiC (SiC of the 2H polytype), 6H—SIC or 15R—SiC. According to an embodiment the semiconductor material is silicon carbide of the 4H polytype (4H—SiC).

At a front side the semiconductor body 100 has a first surface 101 which may include coplanar surface sections. The first surface 101 may coincide with a main crystal plane or may be tilted to a main crystal plane by an off-axis angle α, which absolute value may be at least 2' and at most 12', e.g., about 4°.

In the illustrated embodiment, the <0001> crystal axis is tilted by an off-axis angle α>0 to the normal and the <11-20> crystal axis is tilted by the off-axis angle α with respect to a horizontal plane. The <1-100> crystal axis is orthogonal to the cross-sectional plane.

According to an embodiment, the first surface 101 may be serrated and includes parallel first surface sections shifted to each other and tilted to a horizontal plane by the off-axis angle α as well as second surface sections tilted to the first surface sections and connecting the first surface sections such that cross-sectional line of the serrated first surface 101 approximates a saw-tooth line.

On the back of the semiconductor body 100 an opposite second surface 102 may extend parallel to the first surface 101. A distance between the first surface 101 at the front and a second surface 102 on the back is related to a nominal blocking capability of the semiconductor device 500. A total thickness of the semiconductor body 100 between the first and second surfaces 101, 102 may be in the range of several hundred nm to several hundred μm. The normal to the first surface 101 defines a vertical direction and directions parallel to the first surface 101 are horizontal directions.

The transistor cells TC are formed at the front along the first surface 101. A drain structure 10 separates the transistor cells TC from a second surface 102 at the back. The drain structure 130 may include a heavily doped contact structure 139 directly adjoining the second surface 102 and a lightly doped drift zone 131 between the transistor cells TC and the heavily doped contact structure 139.

The heavily doped contact structure 139 may be or may include a substrate portion obtained from a crystalline ingot and forms an ohmic contact with a second load electrode 320 that directly adjoins the second surface 102. A mean dopant concentration in the contact structure 139 is sufficiently high to ensure an ohmic contact with the second load electrode 320. In case the semiconductor device 500 is or includes an IGFET, the contact structure 139 has the same conductivity type as the drift zone 131. In case the semiconductor device 500 is an IGBT, the contact structure 139 has the complementary conductivity type of the drift zone 131 or includes zones of both conductivity types.

The drift zone 131 may be formed in a layer grown by epitaxy on the contact structure 139. A mean net dopant concentration in the drift zone 131 may be in the range from $1E15$ cm$^{-3}$ to $5E16$ cm$^{-3}$ in case the semiconductor body 100 is from silicon carbide. The drain structure 130 may include further doped regions, for example field stop zones, barrier zones and/or current spread zones of the conductivity type of the drift zone 131 or counter-doped regions.

The drift zone 131 may directly adjoin the contact structure 139 or a buffer layer forming a unipolar homojunction with the drift zone 131 may be sandwiched between the drift zone 131 and the contact structure 139, wherein a vertical extension of the buffer layer may be approximately 1 μm and a mean dopant concentration in the buffer layer may be in a range from $3E17$ cm$^{-3}$ to $1E18$ cm$^{-3}$, by way of example. The buffer layer may relax mechanical stress in the semiconductor body 100 and/or may contribute to shaping the electric field in the drain structure 130.

The transistor cells IC are formed along trench gate structures 150 that extend from the first surface 101 into the semiconductor body 100 such that mesa portions 190 of the semiconductor body 100 separate neighboring trench gate structures 150.

A longitudinal extension of the trench gate structures 150 along a first horizontal direction is greater than a transverse extension along a second horizontal direction orthogonal to the first horizontal direction. The trench gate structures 150 may be long stripes extending from one side of a transistor cell region to an opposite side, wherein the length of the trench gate structures 150 may be up to several millimeters. According to other embodiments a plurality of separated trench gate structures 150 may be formed along a line extending from one side of the transistor cell region to the opposite side, or the trench gate structures 150 may form a grid with the mesa portions 190 formed in the meshes of the grid.

At the bottom, the trench gate structures 150 may be rounded, wherein a radius of the curvature is at least twice the thickness of a gate dielectric 151 described in the following.

The trench gate structures 150 may be equally spaced, may have equal width, and may form a regular pattern, wherein a pitch (center-to-center distance) of the trench gate structures 150 may be in a range from 1 µm to 10 µm, e.g., from 2 µm to 5 µm. A vertical extension of the trench gate structures 150 may be in a range from 0.3 µm to 5 µm, e.g., in a range from 0.5 µm to 2 µm.

The trench gate structures 150 may be vertical to the first surface 101 or may taper with increasing distance to the first surface 101. For example, a taper angle of the trench gate structures 150 with respect to the vertical direction may be equal to the off-axis angle or may deviate from the off-axis angle by not more than ±1 degree such that at least a first mesa sidewall 191 of two opposite longitudinal mesa sidewalls 191, 192 is formed by a main crystal plane providing high charge carrier mobility, e.g., a {11-20} crystal plane. A second mesa sidewall 192 opposite to the first mesa sidewall 191 may be tilted to a main crystal plane by twice the off-axis angle α, e.g., by 4 degree or more, for example, by about 8 degrees. The first and second mesa sidewalls 191, 192 are on opposite longitudinal sides of the intermediate mesa portion and directly adjoin two different, neighboring trench gate structures 150.

The trench gate structures 150 include a conductive gate electrode 155 which may include or consist of a heavily doped polycrystalline silicon layer and/or a metal-containing layer. The gate electrode 155 may be electrically connected to a gate metallization 330 that forms or that is electrically connected or coupled to a gate terminal G.

The trench gate structures 150 further include a gate dielectric 151 separating the gate electrode 155 from the semiconductor body 100 along at least one side of the trench gate structure 150. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.0 V to 8 V.

The trench gate structures 150 may exclusively include the gate electrode 155 and the gate dielectric 151 or may include further conductive and/or dielectric structures in addition to the gate electrode 155 and the gate dielectric 151, e.g., compensation structures.

The mesa portions 190 include source regions 110 that are oriented to the front side. The source regions 110 may directly adjoin the first surface 101 and directly adjoin both longitudinal mesa sidewalls 191, 192 of the respective mesa portion 190. In horizontal planes parallel to the first surface 101 separation regions 240 of a conductivity type opposite to the conductivity type of the source regions 110 may be sandwiched between sections of the source regions 110. Each mesa portion 190 may include one source region 110 with interconnected sections or may include two or more sections separated from each other within the mesa portion 190 but electrically connected to each other through a low impedance path through a mesa contact structure directly adjoining the mesa portion 190.

The mesa portions 190 further include body regions 120 that separate the source regions 110 from the drain structure 130. The body regions 120 form first pn junctions pn1 with the drain structure 130 and second pn junctions pn2 with the source regions 110. The body regions 120 directly adjoin the first mesa sidewall 191. A vertical extension of the body regions 120 corresponds to a channel length of the transistor cells TC and may be in a range from 0.2 µm to 1.5 µm. Both the source regions 110 and the body regions 120 are electrically connected to a first load electrode 310 at the front side.

The first load electrode 310 may form or may be electrically connected or coupled to a first load terminal L1, which may be an anode terminal of an MCD, a source terminal of an IGFET or an emitter terminal of an IGBT. The second load electrode 320 on the back may form or may be electrically connected or coupled to a second load terminal L2, which may be a cathode terminal of an MCD, a drain terminal of an IGFET or a collector terminal of an IGBT.

Diode regions 140 may separate the body regions 120 and the second mesa sidewalls 192. The separation regions 240 may be surface sections of the diode regions 140. A dopant concentration in the diode regions 140 along the second mesa sidewalls 192 is higher, e.g., at least ten times higher than a dopant concentration in the body regions 120 along the first mesa sidewalls 191.

According to an embodiment, the transistor cells TC are n-channel FET cells with p-doped body regions 120, n-doped source regions 110 and n-doped drift zone 131. According to another embodiment, the transistor cells TC are p-channel FET cells with n-doped body regions 120, p-doped source regions 110 and p-doped drift zone 131.

The gate dielectric 151 capacitively couples portions of the body regions 120 with the gate electrode 155. When a potential at the gate electrode 155 exceeds or falls below a threshold voltage of the semiconductor device 500, the electric field effects that the minority charge carriers in the body regions 120 form inversion channels along the gate dielectric 151, wherein the inversion channels connect the source regions 110 with the drain structure 130, thereby turning on the semiconductor device 500. In the on-state, a load current flows through the semiconductor body 100 approximately along the first mesa sidewalls 191 between the first and second load electrodes 310, 320. At the same time the higher dopant concentration in the diode regions 140 suppresses the formation of inversion channels along the second mesa sidewalls 192.

In case the semiconductor device 500 is an IGFET, a gate-to-drain capacitance $C_{gd}$ is effective between the second load terminal 12 and the gate terminal G, a gate-to-source capacitance $C_{gs}$ is effective between the gate terminal G and the first load terminal L1 and a drain-to-source capacitance $C_{ds}$ is effective between the first and the second load terminals L1, L2. A threshold voltage charge $Q_{th}$ defines the amount of charge necessary for lifting the potential at the gate terminal G to a threshold voltage at which the load current path between the drain and source becomes conductive and a Miller charge $Q_{gd}$ loads the gate-to-drain capacitance $C_{gd}$.

Typically, the ratio $Q_{gd}/Q_{th}$ affects the probability for that the semiconductor device 500 unintentionally turns on when voltage peaks, which may be generated when the semiconductor device 500 turns off, are coupled to the gate electrode 155 through the Miller capacitance $C_{gd}$. The greater the Miller capacitance $C_{gd}$ is in relation to $C_{gs}$, the higher is the probability and the risk that the semiconductor device 500 unintentional turns on. Unintentional turn-on decreases the efficiency of a switching circuit including the semiconductor device 500. For example, where the semiconductor device 500 is a high-side switch or a low-side switch in a half-bridge circuit, a short-circuit condition with both switches turned on may occur. On the other hand, with decreasing ratio $Q_{gd}/Q_{th}$, the probability for triggering undesired oscillations in the application increases. Depending on the ratio $Q_{gd}/Q_{th}$, the semiconductor device 500 has either a high risk for unintentional turn-on or a high risk for unintentional oscillations.

Due to the different orientation with respect to the main crystal planes, a semiconductor interface of a gate dielectric portion formed on the second mesa sidewalls 192 may contain more interface states for charge carriers than a semiconductor interface of a gate dielectric portion on the first mesa sidewalls 191 such that the threshold voltages for inversion channels formed along the two mesa sidewalls are different. For allowing a narrow specification of the threshold voltage, source regions 110 are typically formed exclusively along the first mesa sidewalls 191, which are main crystal planes, whereas formation of inversion channels along the second mesa sidewalls 192, which are tilted to main crystal planes, is typically suppressed by omitting the formation of source regions along the second mesa sidewalls 192. In addition, forming the source regions 110 only along the first mesa sidewalls 191 relaxes overlay tolerances for contact structures to the body regions 120 and for other structures shielding the gate dielectric 151 against the drain potential.

By contrast, forming the source regions 110 despite of all also at least along portions of the second mesa sidewalls 192 allows for increasing $C_{gs}$ without negative impact on other device parameters. In addition, the ratio $Q_{th}$ to $Q_{gs}$ can be adjusted to be about 1, such that $Q_{th}$ is approximately equal to $Q_{gs}$.

Figure 2A:
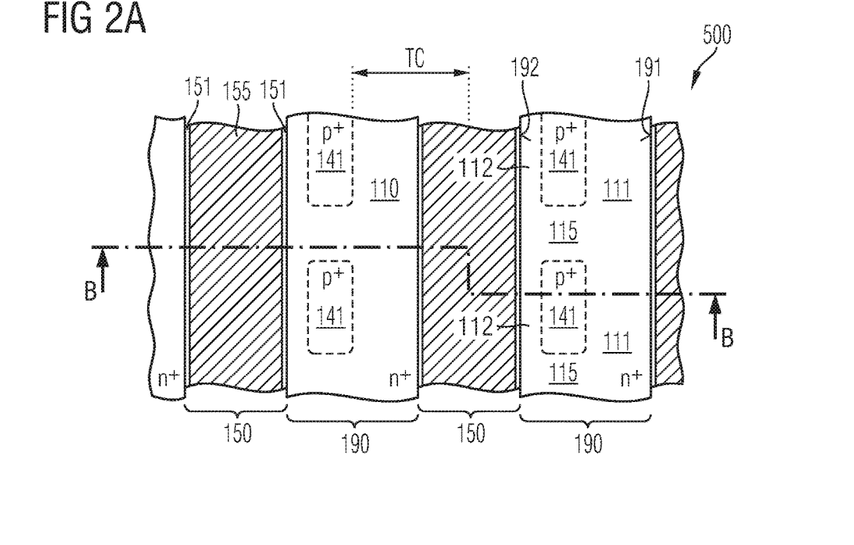
FIG. 2A is a schematic horizontal cross-sectional view of a portion of a wide-bandgap semiconductor device with trench gate structures according to an embodiment with surface sections of diode regions, wherein the surface sections separate connection sections of the source regions.
Figure 2B:
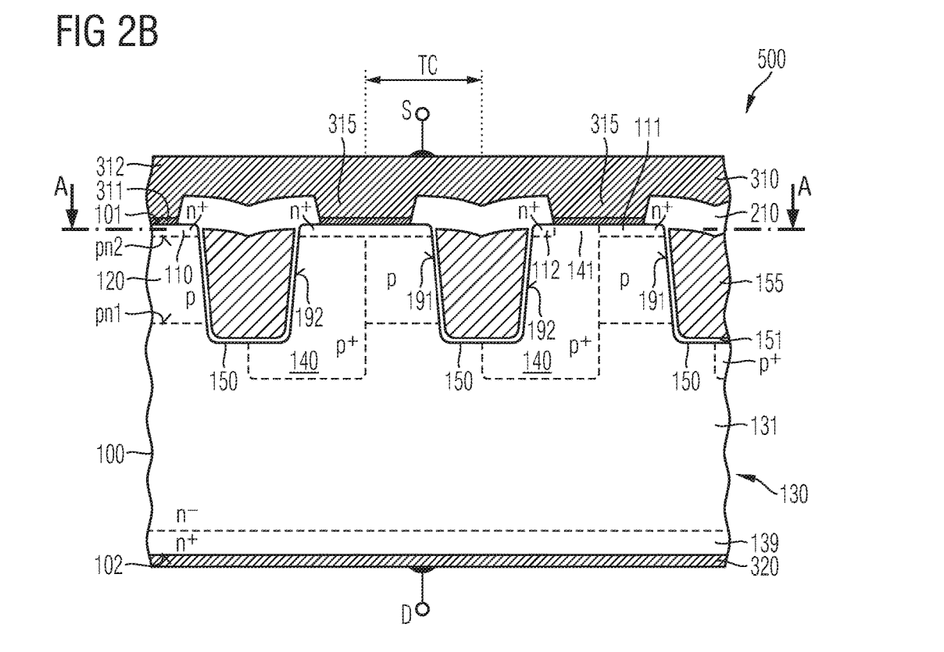
FIG. 2B is a schematic vertical cross-sectional view of the semiconductor device portion of FIG. 2A along line B-B.

In FIGS. 2A and 2B the wide-bandgap semiconductor device 500 is an IGFET, wherein the first load electrode 310 forms or is electrically connected to a source terminal S and the second load electrode 320 forms or is electrically connected to a drain terminal D. The semiconductor device 500 includes diode regions 140 extending between the body regions 120 and the second mesa sidewalls 192 from the first surface 101 into the mesa portions 190. In each mesa portion 190, surface sections 141 of the diode regions 140 are laterally sandwiched between sections of the source region 110.

The diode regions 140 are electrically connected or coupled to the first load electrode 310 and may vertically overlap with the trench gate structures 150 such that portions of the diode regions 140 are formed in the vertical projection of the trench gate structures 150. A mean net dopant concentration in the diode regions 140 is higher than a mean net dopant concentration in the body regions 120. The portions of the diode regions 140 in the vertical projection of the trench to structures 150 may shield active portions of the gate dielectric 151 against a high potential of the second load electrode 320 in a blocking state of the semiconductor device 500. The diode regions 140 form third pn junctions pn3 with the drain structure 130 and may provide a fly-back diode functionality integrated in the semiconductor device 500. A distance between opposing edges of neighboring diode regions 140 may be in a range from 2 µm to 3 µm, by way of example.

Stripe-shaped portions of an interlayer dielectric 210 separate the gate electrodes 155 in the trench gate structures 150 from the first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass), BPSG (boron phosphorus silicate glass), FSG (fluorosilicate glass) or a spin-on glass, by way of example.

Mesa contact structures 315 extend from the first load electrode 310 through openings in the interlayer dielectric 210 to the mesa portions 190 and directly adjoin the source regions 110 and to the diode regions 140. According to the illustrated embodiment the mesa contact structures 315 end on the first surface 101. According to other embodiments, the mesa contact structures 315 may extend into the semiconductor body 100.

Each of the first load electrodes 310, the mesa contact structures 315 and the second load electrode 320 may consist of or contain, as main constituent(s) aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, N, Sn, Pt, and Pd as main constituent (s), e.g., a silicide, a nitride and/or an alloy.

For example, the mesa contact structures 315 may include a thin metal-containing interface layer 311 of titanium (Ti) directly adjoining the mesa portions 190.

In each mesa portion 190, the source region 110 includes a first section 111 directly adjoining the first mesa sidewall 191, a second section 112 directly adjoining the second mesa sidewall 192 and may include connection sections 115 sandwiched between and directly adjoining the first and second sections 111, 112. The surface sections 141 of the diode region 140 separate the connection sections 115 from each other along the horizontal longitudinal axis of the mesa portion 190. A first horizontal extension of the connection sections 115 along the longitudinal axes of the mesa portions 190 may be smaller than a distance between neighboring connections sections 115 along the longitudinal axes of the mesa portions 190. A first horizontal extension of the connection sections 115 along the longitudinal axes of the mesa portions 190 may be at least 200 nm and at most 5 µm.

Along the horizontal longitudinal axis of the mesa portion 190, the mesa contact structure 315 alternatingly forms ohmic contacts with the surface sections 141 of the diode regions 140 and with the connection sections 115 of the source region 110. A horizontal width of the second sections 112 parallel to the horizontal transverse axis of the mesa portions 190 may be smaller than the overlap of the interlayer dielectric 210 with the mesa portion 190 such that the interlayer dielectric 210 completely covers the second sections 112 and such that the second sections 112 do not reduce the contact area between the mesa contact structures 315 and the diode regions 140. A vertical extension of the second sections 112 orthogonal to the first surface 101 may be at least 200 nm and at most 1 µm.

The source region 110 assigned to a mesa portion 190 forms a ladder-like structure with the first and second sections 111, 112 forming the rails and with the connection sections 115 forming the rungs of the ladder, where the rails may have different widths.

Figure 3A:
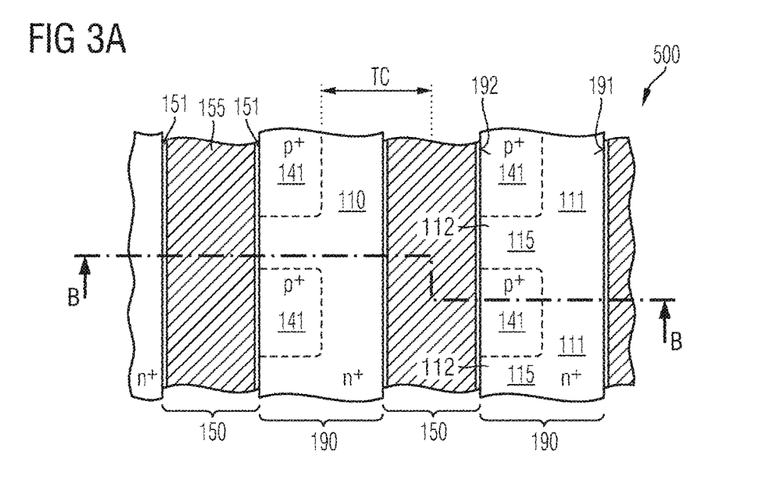
FIG. 3A is a schematic horizontal cross-sectional view of a portion of a wide-bandgap semiconductor device according to an embodiment concerning interrupted source sections along second sidewalls of the mesa portions and with diode regions including connection portions and shielding portions.
Figure 3B:
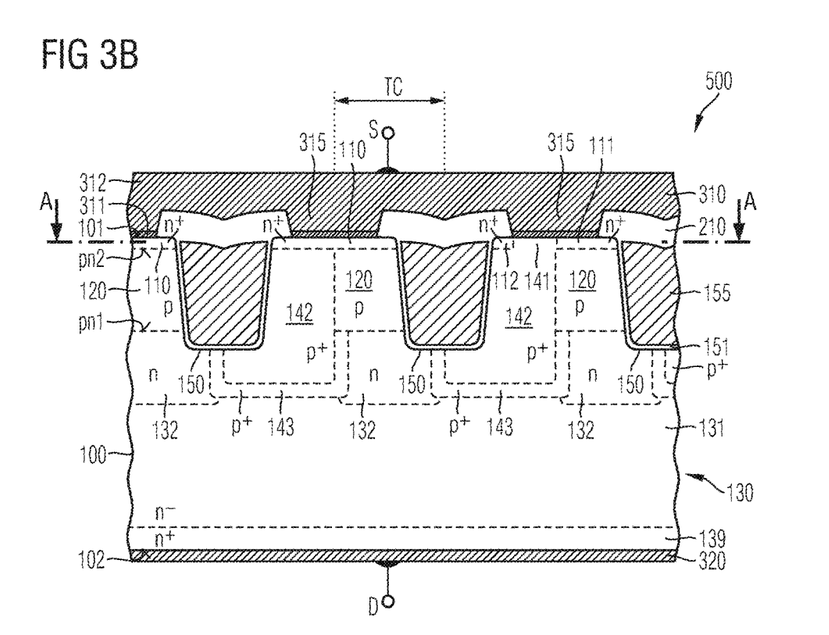
FIG. 3B is a schematic vertical cross-sectional view of the semiconductor device portion of FIG. 3A along line B-B.

In the semiconductor device 500 of FIGS. 3A and 3B a plurality of second sections 112 has the same horizontal extension along the horizontal longitudinal axis of the mesa portion 190 as the connection sections 115. The surface sections 141 of the diode regions 140 alternate with the second sections 112 along the second mesa sidewalls 192.

The diode regions 140 include shielding portions 143 that directly adjoin the drain structure 130 as well as contact portions 142 connecting the shielding portions 143 with the first load electrode 310 through the heavily doped surface sections 141. A mean net dopant concentration in the contact portion 142 is at least ten times as high as a mean net dopant concentration in the body regions 120. The shielding portion 143 may include sections in a with respect to the first surface 101 vertical projection of the trench gate structures 150. A distance between neighboring shielding portions 143 may be between 0.5 µm and 3 µm, by way of example.

The drain structure 130 may include current spread zones 132 between the body regions 120 and the drift zone 131, wherein the current spread zones 132 may be sandwiched between the body regions 120 and the drift zone 131 or may be spaced from the body regions 120. A mean dopant concentration in the current spread zones 132 is at least twice, for example at least ten times as high as a mean dopant concentration in the drift zone 131. The reduced lateral ohmic resistance in the current spread zones 132 spreads the charge carrier flow through the body regions 120 along the horizontal directions such that a more uniform current distribution is achieved in the drift zone 131 even at a low dopant concentration in the drift zone 131.

According to the illustrated embodiment the current spread zones 132 directly adjoin the body regions 120 and are formed between neighboring shielding portions 143. Unipolar homojunctions between the current spread zones 132 and the drift zone 131 may have a distance to the first surface 101 that is equal to, smaller than or greater than a distance of the third pn junctions pn3 between the diode regions 140 and the drift zone 131 to the first surface 101. The current spread zones 132 may be formed exclusively in the horizontal projection of the adjoining diode regions 140 or may overlap with the shielding portions 143 such that portions of the current spread zones 132 are formed in the vertical projection of the shielding portions 143. According to another embodiment, the current spread zones 132 may form a continuous layer between the shielding portions 143 and the drift zone 131.

Figure 4A:
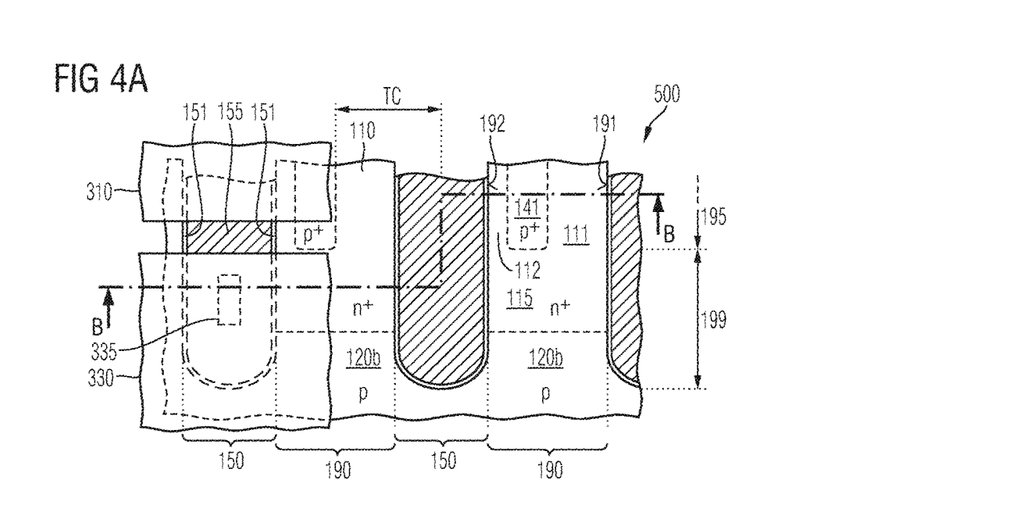
FIG. 4A is a schematic horizontal top view of a portion of a wide-bandgap semiconductor device according to an embodiment with connection sections of the source regions only formed in end sections of the mesa portions.
Figure 4B:
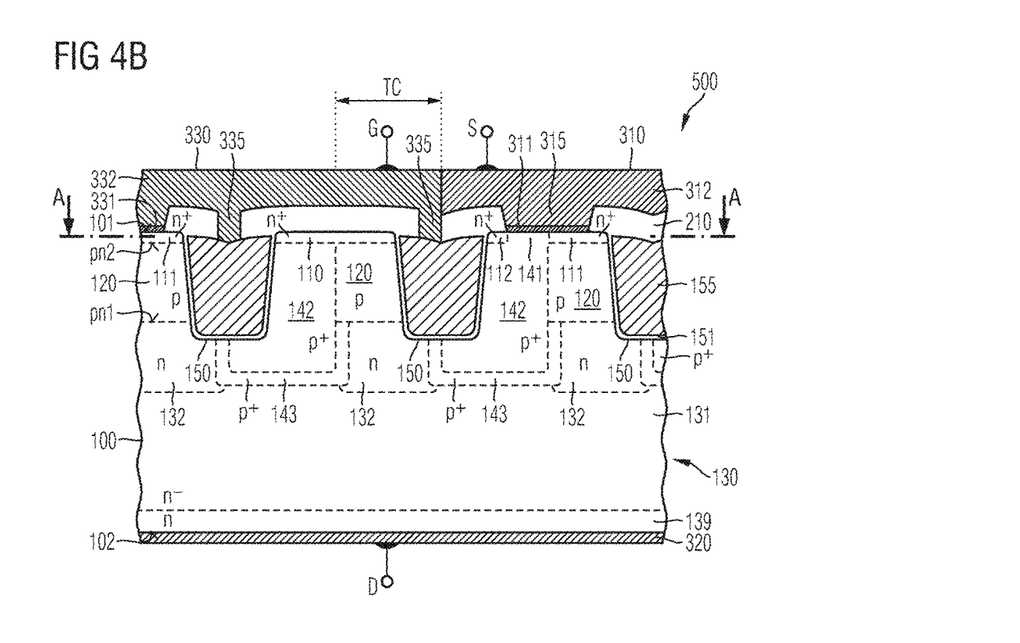
FIG. 4B is a schematic vertical cross-sectional view of the semiconductor device portion of FIG. 4A along line B-B.

In FIGS. 4A to 4B, the connection sections 115 of the source regions 110 are exclusively formed in end sections 199 of the mesa portions 190 such that the total contact area a for the diode region 140 is not affected by the formation of the second sections 112 and the connection sections 115 of the source regions 110.

Figure 5A:
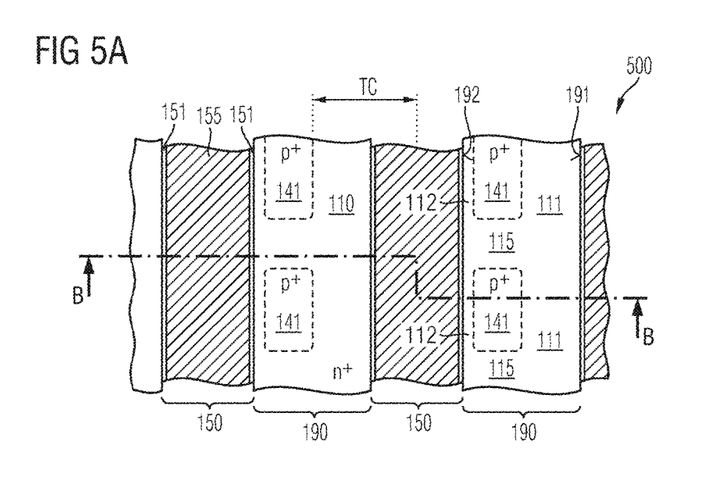
FIG. 5A is a schematic horizontal cross-sectional view of a portion of a wide-bandgap semiconductor device according to an embodiment with second sections of the source regions along second mesa sidewalls having a greater vertical extension than first sections of the source regions along first mesa sidewalls.
Figure 5B:
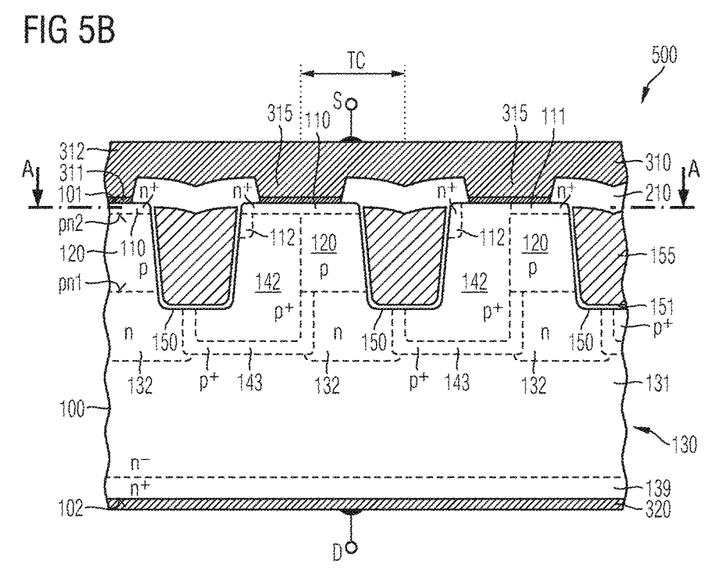
FIG. 5B is a schematic vertical cross-sectional view of the semiconductor device portion of FIG. 5A along line B-B.

In the semiconductor device of FIGS. 5A to 5B, a vertical extension of the second sections 112 is greater than a vertical extension of the first sections 111 of the source region 110. The increased vertical extension of the second sections 112 further increases the gate-to-source capacity $C_{gs}$ due to the larger overlap area between source region 110 and gate electrode 155.

A gate metallization 330 may be formed in the vertical projection of the end sections 199 of the mesa portions 190 and in the vertical projection of end sections of the trench gate structures 150 sandwiched between the end sections of the mesa portions 190. Gate contact structures 335 may extend from the gate metallization 330 through openings in the interlayer dielectric 210 above the trench gate structures 150 and directly adjoin the gate electrodes 155 in the trench gate structures 150.

The first load electrode 310 may be formed in a vertical projection of central sections 195 of the mesa portions 190 between two opposite end sections 199 and above portions of the trench gate structures 150 sandwiched between central sections 195 of the mesa portions 190. The mesa contact structures 315 extend from the first load electrode 310 through openings of the interlayer dielectric 210 to the central sections 195 of the mesa portions 190.

Figure 6A:
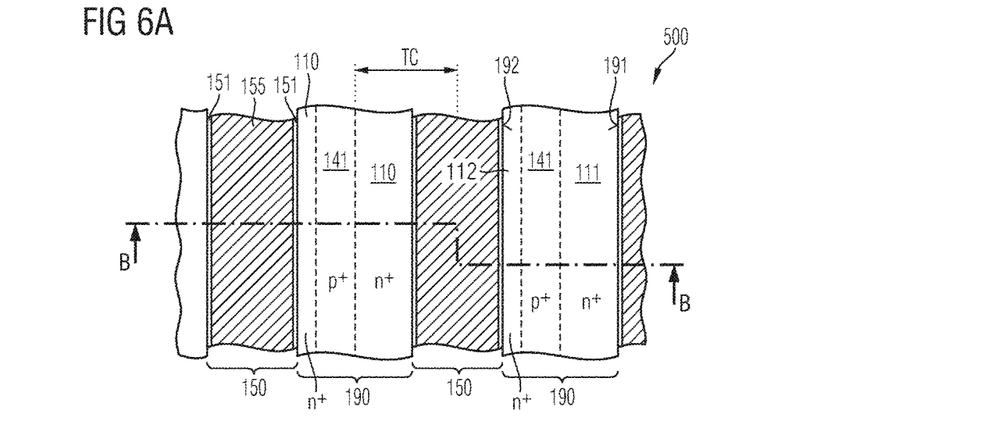
FIG. 6A is a schematic horizontal cross-sectional view of a portion of a wide-bandgap semiconductor device according to an embodiment with second sections separated from the first sections.
Figure 6B:
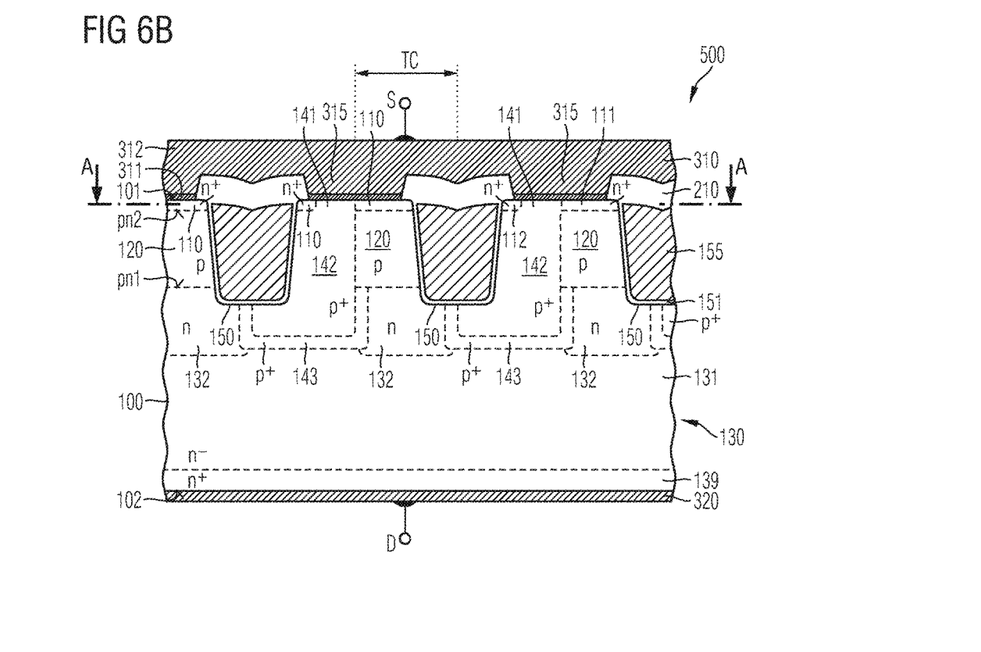
FIG. 6B is a schematic vertical cross-sectional view of the semiconductor device portion of FIG. 6A along line B-B.

In FIGS. 6A and 6B, the surface sections 141 of the diode region 140 completely separate the second sections 112 along second mesa sidewalls 192 from the first sections 111 along the first mesa sidewalls 191. The mesa contact structures 315 are formed to overlap with the first sections 111, with the surface sections 141 and with the second sections 112.

Figure 7A:
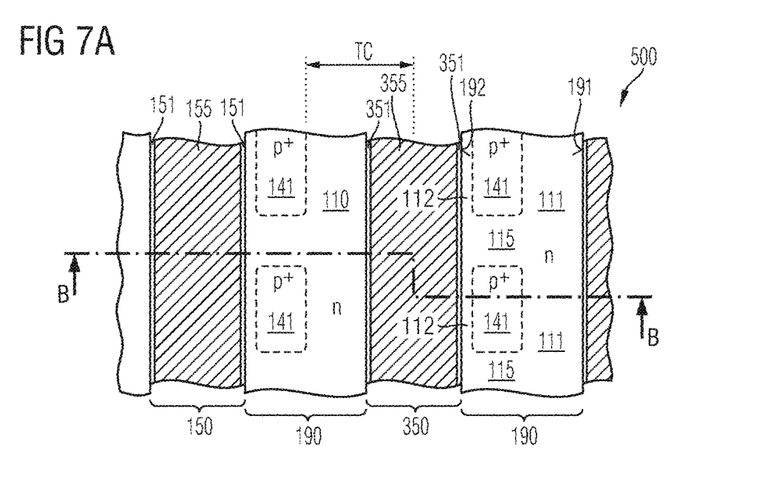
FIG. 7A is a schematic horizontal cross-sectional view of a portion of a wide-bandgap semiconductor device according to an embodiment combining ladder-shaped source regions and trench source structures for increasing the output capacitance.
Figure 7B:
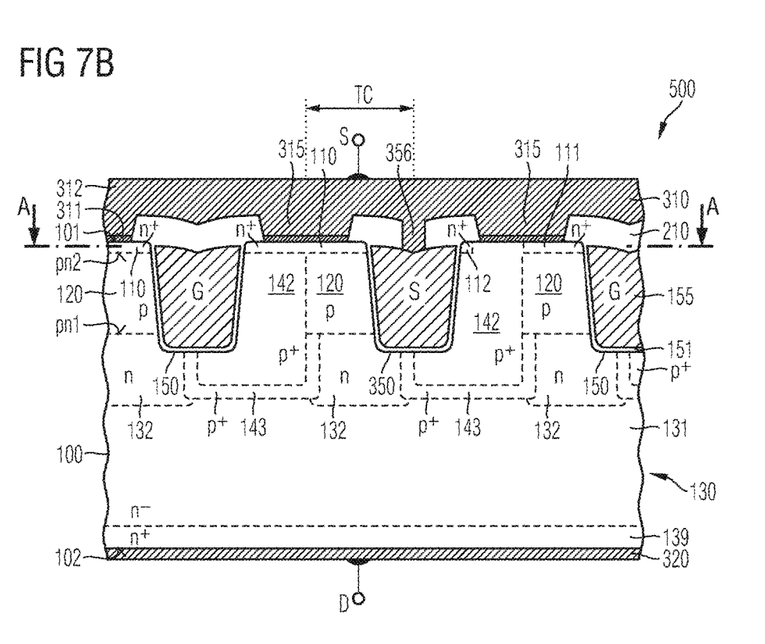
FIG. 7B is a schematic vertical cross-sectional view of the semiconductor device portion of FIG. 7A along line B-B.

The semiconductor device 500 of FIGS. 7A to 7B includes trench source structures 350 that may have the same lateral and vertical dimensions as the trench gate structures 150. The trench source structures 350 include a trench source electrode 355 from the same material or the same materials as the gate electrode 155 and a source insulator 351 from the same material and the same dimensions as the gate dielectric 151. Source contact structures 356 extend from the first load electrode 310 through openings of the interlayer dielectric 210 and electrically connect the trench source electrode 355 to the first load electrode 310. According to an embodiment the trench source structures 350 regularly alternate with trench gate structures 150. The ratio of trench source structures 350 to the sum of trench gate structures 150 and trench source structures 350 may be in a range from 5% to 20%, for example approximately 10%.

The trench source structures 350 increase the capacitance between the first, load electrode 310 and the second load electrode 320, which is proportional to the drain-to-source capacitance $C_{ds}$, or output capacitance $C_{oss}$. The higher output capacitance $C_{oss}$ suppresses oscillations triggered during turning off the semiconductor device 500.

According to an embodiment, the semiconductor device 500 has a nominal blocking voltage of 600 V or higher. Since the output capacitance significantly drops with increasing blocking voltage, the increase of $C_{oss}$ is effective to a high degree.

According to another embodiment, neighboring trench source structures 350 are separated by at least nine, for example, by at least 19 trench gate structures 150.

Figure 8A:
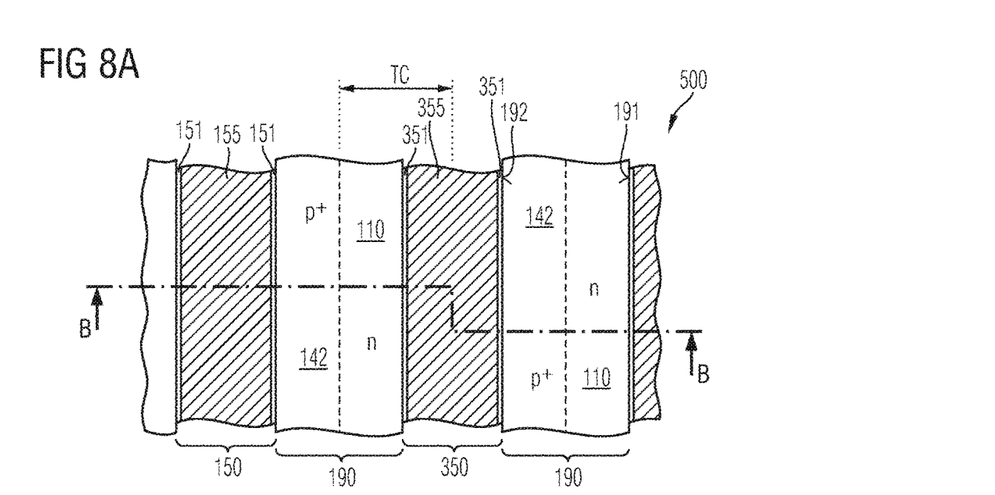
FIG. 8A is a schematic horizontal cross-sectional view of a portion of a wide-bandgap semiconductor device according to another embodiment with trench source structures.
Figure 8B:
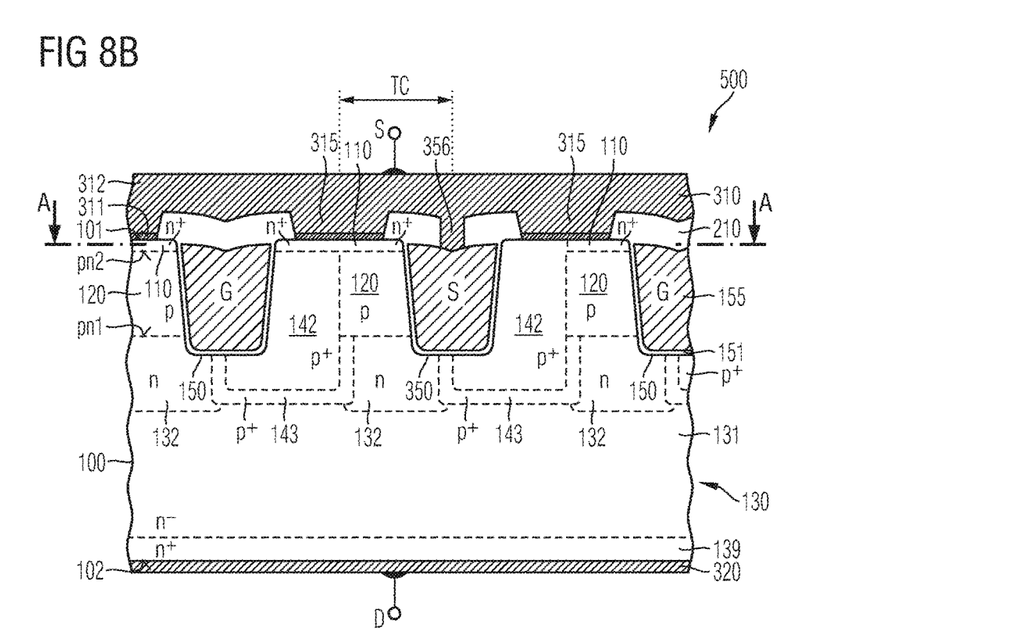
FIG. 8B is a schematic vertical cross-sectional view of the semiconductor device portion of FIG. 8A along line B-B.

In FIGS. 8A to 8B, the semiconductor device 500 includes trench source structures 350 in combination with source regions 110 that directly adjoin both longitudinal mesa sidewalls 191, 192.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body formed from a semiconductor material with a band-gap of at least 2.0 eV, the semiconductor body having a diode region and a source region; and
    a trench gate structure having a first sidewall and a second sidewall opposite the first sidewall, the first side-wall and the second side-wall extending along a common longitudinal direction, wherein the trench gate structure projects from a first surface of the semiconductor body into the semiconductor body, wherein a first portion of the second sidewall at the first surface is directly adjoined by the source region, wherein a second portion of the second sidewall is in direct contact with the diode region.

2. The semiconductor device of claim 1, wherein the diode region is of a first conductivity type and the source region is of a second conductivity type complementary to the first conductivity type.

3. The semiconductor device of claim 2, wherein in a horizontal plane parallel to the first surface, the semiconductor device further comprises a separation region of the first conductivity type disposed between sections of the source region.

4. The semiconductor device of claim 3, wherein the separation region extends to a same depth in the semiconductor body as the diode region.

5. The semiconductor device of claim 3, wherein with respect to the first surface of the semiconductor body, the trench gate structure extends deeper in the semiconductor body than the diode region and the separation region.

6. The semiconductor device of claim 1, wherein a surface section of the diode region is laterally disposed between sections of the source region at the first surface of the semiconductor body.

7. The semiconductor device of claim 1, wherein the diode region extends under a bottom of the trench gate structure.

8. The semiconductor device of claim 1, wherein the diode region comprises a heavily doped surface section at the first surface of the semiconductor body, a shielding portion directly adjoining a drain structure of the semiconductor device, and a contact portion connecting the shielding portion with a load electrode through the heavily doped surface section.

9. The semiconductor device of claim 8, further comprising a body region disposed below and directly adjoining the source region, wherein the drain structure comprises a drift zone and a current spread zone between the body region and the drift zone.

10. The semiconductor device of claim 9, wherein the current spread zone of the drain structure directly adjoins the shielding portion of the diode region under the trench gate structure.

11. The semiconductor device of claim 1,
wherein the semiconductor device comprises a plurality of trench gate structures, each trench gate structure having a first sidewall and a second sidewall,
wherein the trench gate structures extend along a common longitudinal direction, and
wherein the trench gate structures have a stripe pattern in a top view onto the semiconductor device.

12. The semiconductor device of claim 1,
wherein the semiconductor device comprises at least two source regions, and
wherein a first section of one of the two source regions directly adjoins the second sidewall of the trench gate structure and a second section of the other of the two source regions directly adjoins the first sidewall of the trench gate structure.

13. The semiconductor device of claim 1, wherein the second portion of the second sidewall is disposed below the first portion.

14. The semiconductor device of claim 1, wherein the semiconductor body further comprises a body region directly adjoining the first sidewall of the trench gate structure, and wherein a doping concentration of a first doping type is higher in the diode region than in the body region.

15. A semiconductor device, comprising:
a semiconductor body formed from a semiconductor material with a band-gap of at least 2.0 eV, the semiconductor body having a diode region; and
a trench gate structure having a first sidewall and second sidewall opposite the first sidewall, the first sidewall and the second sidewall extending along a common longitudinal direction,
wherein the trench gate structure projects from a first surface of the semiconductor body into the semiconductor body,
wherein a portion of the second sidewall near the first surface is free of the diode region, and the entire remaining part of the second sidewall is directly adjoined by the diode region.

16. The semiconductor device of claim 15, wherein the diode region extends under a bottom of the trench gate structure.

17. The semiconductor device of claim 15, wherein the diode region comprises a heavily doped surface section at the first surface of the semiconductor body, a shielding portion directly adjoining a drain structure of the semiconductor device, and a contact portion connecting the shielding portion with a load electrode through the heavily doped surface section.

18. The semiconductor device of claim 17, further comprising a body region adjacent the second sidewall of the trench gate structure, wherein the drain structure comprises a drift zone and a current spread zone between the body region and the drift zone.

19. The semiconductor device of claim 18, wherein the current spread zone of the drain structure directly adjoins the shielding portion of the diode region under the trench gate structure.

20. The semiconductor device of claim 15,
wherein the semiconductor device comprises a plurality of trench gate structures, each trench gate structure having a first sidewall and a second sidewall,
wherein the trench gate structures extend along a common longitudinal direction, and
wherein the trench gate structures have a stripe pattern in a top view onto the semiconductor device.

21. The semiconductor device of claim 15, wherein the semiconductor material is silicon carbide or gallium nitride.

* * * * *

UNITED STATES PATENT AND TRADEMARK OFFICE
CERTIFICATE OF CORRECTION

| | |
|---|---|
| PATENT NO. | : 10,211,306 B2 |
| APPLICATION NO. | : 15/866755 |
| DATED | : February 19, 2019 |
| INVENTOR(S) | : R. Siemieniec et al. |

Page 1 of 1

It is certified that error appears in the above-identified patent and that said Letters Patent is hereby corrected as shown below:

In the Claims

Column 10, Line 65, Claim 1, Line 7, change "side-wall" to -- sidewall --.
Column 10, Line 66, Claim 1, Line 8, change "side-wall" to -- sidewall --.

Signed and Sealed this
Twenty-first Day of May, 2019

Andrei Iancu
*Director of the United States Patent and Trademark Office*